United States Patent [19]
Shimada

[11] Patent Number: 6,028,388
[45] Date of Patent: Feb. 22, 2000

[54] PIEZOELECTRIC TRANSFORMER DRIVER

[75] Inventor: Yasuhei Shimada, Tokyo, Japan

[73] Assignee: NEC Corporation, Tokyo, Japan

[21] Appl. No.: 08/940,993

[22] Filed: Sep. 30, 1997

[30] Foreign Application Priority Data

Sep. 30, 1996 [JP] Japan .................................. 8-258389

[51] Int. Cl.[7] .................................................. H01L 41/08
[52] U.S. Cl. ............................................................ 310/318
[58] Field of Search .................................... 310/314, 316, 310/318, 319; 323/355, 358

[56] References Cited

U.S. PATENT DOCUMENTS

| | | | |
|---|---|---|---|
| 5,705,877 | 1/1998 | Shimada | 310/318 |
| 5,859,489 | 1/1999 | Shimada | 310/318 |
| 5,886,514 | 3/1999 | Iguchi et al. | 323/299 |
| 5,894,184 | 4/1999 | Furuhashi et al. | 310/316 |

FOREIGN PATENT DOCUMENTS

| | | |
|---|---|---|
| 7-147771 | 6/1995 | Japan . |
| 7-177736 | 7/1995 | Japan . |
| 8-107678 | 4/1996 | Japan . |
| 8-275553 | 10/1996 | Japan . |

*Primary Examiner*—Matthew Nguyen
*Attorney, Agent, or Firm*—Sughrue, Mion, Zinn, Macpeak & Seas, PLLC

[57] ABSTRACT

In a steady-state operation, a rectified voltage obtained from an output current Io of a piezoelectric transformer 1 is compared in a comparator 10 with Vref. When the voltage is lower than Vref, a signal Vdown is at an "H" level, and otherwise it is at an "L" level. A switch SW1 or SW2 is thus turned on to charge or discharge a capacitor Cvco. This has an effect of sweeping the oscillation frequency of a VCO 14 downward or upward to increase or reduce the output voltage Vo of the piezoelectric transformer 1 which is driven at the oscillation frequency. When a load 2 is open-circuited, a voltage VR obtained from an output voltage Vo becomes higher than Vmax to set a flip-flop 13 and turn on a switch SW3. The capacitor voltage Vvco is thus reduced to reduce the oscillation frequency of the VCO 14 and reduce the output voltage Vo. When the voltage VR becomes lower than Vmin, the flip-flop 18 is reset by the output of the comparator 16 to turn off the switch SW3.

6 Claims, 14 Drawing Sheets

FIG. 11 (a) PRIOR ART
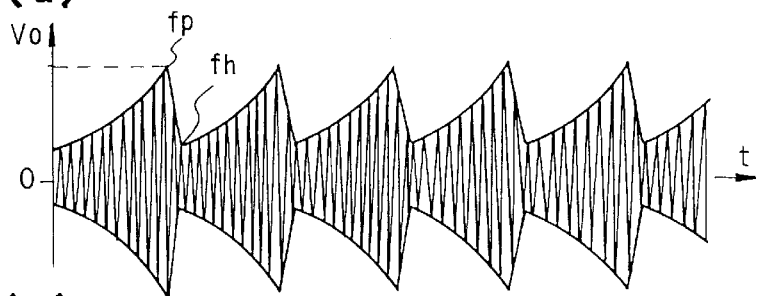
FIG. 11 (b) PRIOR ART
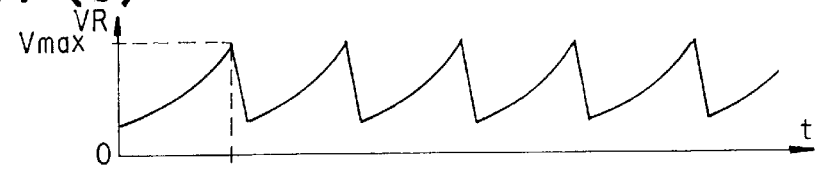
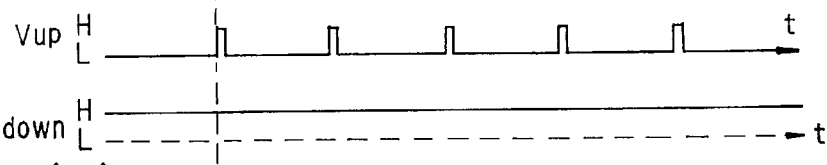
FIG. 11 (c) PRIOR ART
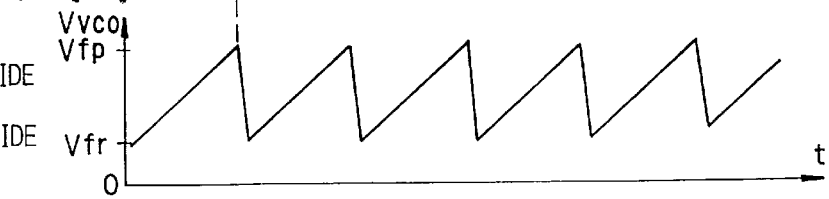
FIG. 11 (d) PRIOR ART
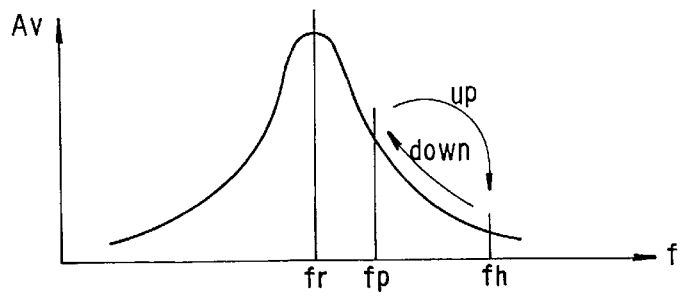

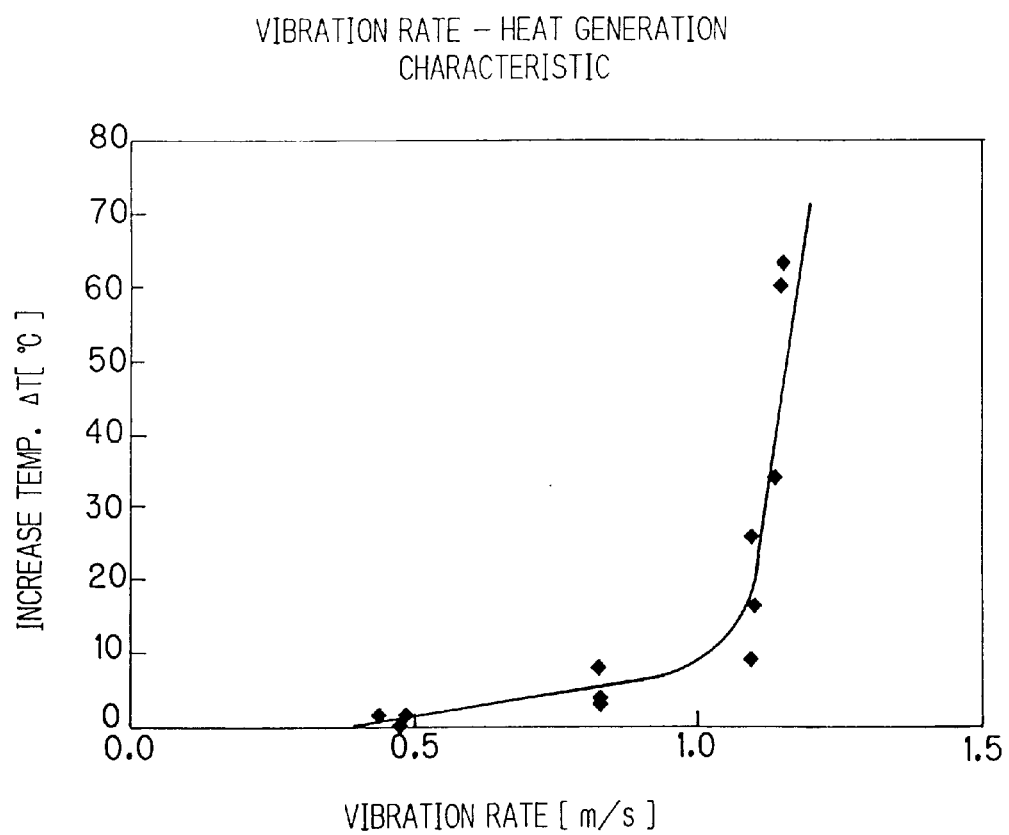

FIG. 14 (a) PRIOR ART
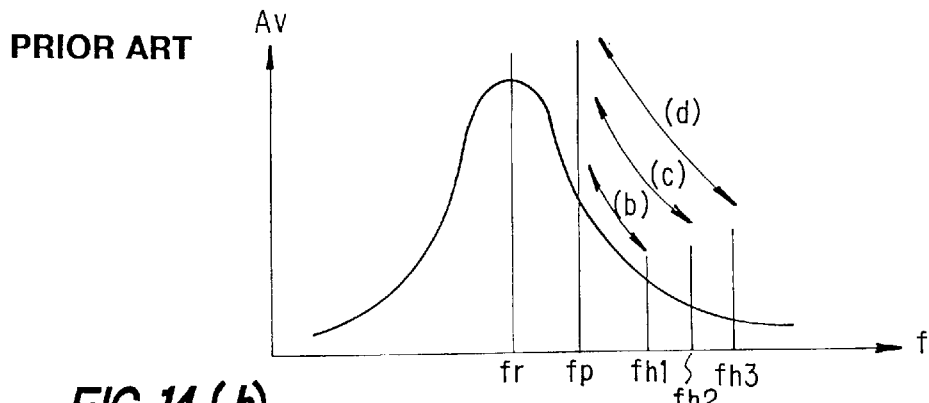
FIG. 14 (b) PRIOR ART
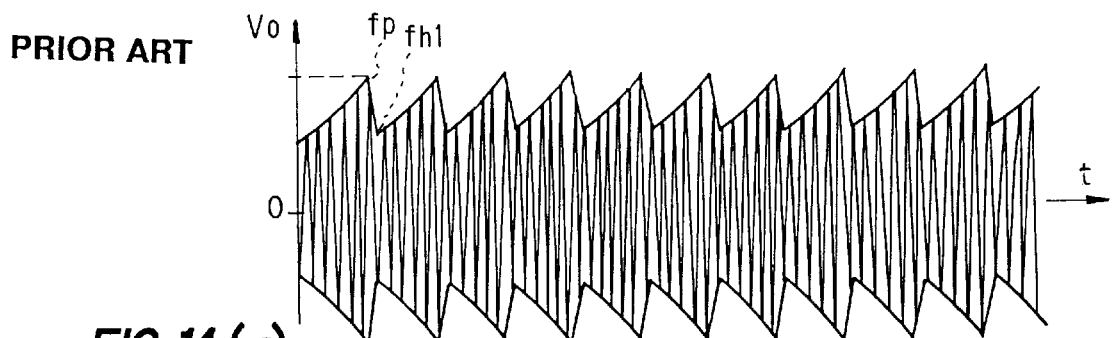
FIG. 14 (c) PRIOR ART
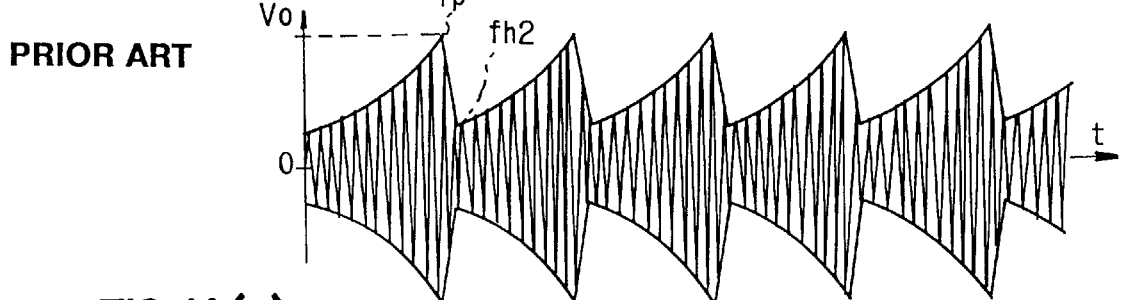
FIG. 14 (d) PRIOR ART
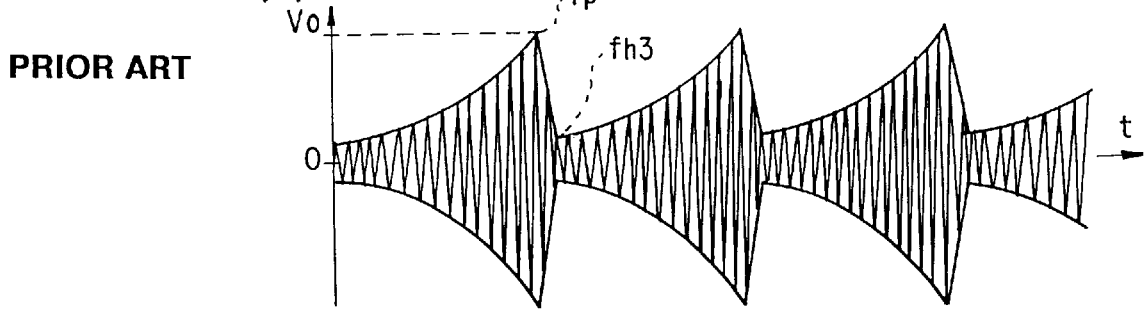

PIEZOELECTRIC TRANSFORMER DRIVER

BACKGROUND OF THE INVENTION

The present invention relates to a piezoelectric transformer driver and, more particularly, to a piezoelectric transformer driver with a function of protecting a piezoelectric transformer and a drive circuit therefor.

A piezoelectric transformer is generally a voltage converting element, which utilizes the piezoelectric effect of a piezoelectric element for generating mechanical oscillations and taking out a converted voltage from its secondary electrode side. Compared to conventional electromagnetic transformers, the piezoelectric transformer has features that it can be reduced in size and thickness and also has a merit that it can ensure higher safety. Thus, it finds extensive applications to CCFL (Cold Cathode Fluorescent Lamp) drive inverters, DC—DC converters, high voltage generators, and so forth.

FIG. 5(a) shows a perspective view of a third-order Rosen piezoelectric transformer. The illustrated piezoelectric transformer 1 comprises a piezoelectric ceramic plate 1c with primary and secondary electrodes 1a and 1b formed on both plate surfaces. It is polarized in the thickness direction on the side of the primary electrodes 1a and in the longitudinal direction on the side of the secondary electrodes 1b. When an AC voltage is applied to the primary electrode side, thickness direction oscillations are generated in the plate to generate a compressional wave propagating in the longitudinal direction of the plate, thus generating oscillations at a resonant frequency, which is determined by the propagation velocity of sound through the piezoelectric ceramic and the shape thereof. The oscillations thus generated are converted on the secondary electrode side into electric energy. The applied voltage thus can be stepped up on the secondary side in proportion to the thickness of the plate and the distance between the primary and secondary electrodes. FIG. 5b shows the equivalent electric circuit of the piezoelectric transformer 1. At the resonant frequency, a drive voltage Vs of a drive circuit 5 is stepped up to an output voltage Vo, which is outputted to a load 2.

The present invention concerns a drive for an inverter or a high voltage source using the above piezoelectric transformer and, more particularly, such a drive with a protective function for the piezoelectric transformer or a drive circuit therefor. For example, in a 12.1-inch color liquid crystal back-light, a CCFL as a load, which has a length of 255 mm and a diameter of 2 mmφ, requires a lamp voltage of about 700 Vrms and a lamp current of about AC 3 mArms. The CCFL requires as high voltage as several kV to cause its discharge. Once its discharge has been started, however, it continues the discharge regardless of reducing the applied voltage.

With a piezoelectric transformer, as shown in FIG. 6, the step-up ratio Av that is obtainable is high when the load impedance RL is high, but is reduced with reducing load impedance. The CCFL constitutes a high impedance load until it is turned on, because it carries no output current up to this time. During this stage, the piezoelectric transformer provides increasing output voltage due to its high step-up ratio, thereby starting the discharging operation between its cold cathodes. Once the discharge between the cold cathodes is caused, the output current flows. The load impedance is thus reduced to reduce the step-up ratio and the output voltage. It will be seen that the piezoelectric transformer has a character suited for driving a CCFL or like load.

In the piezoelectric transformer, the output voltage and the oscillation rate are substantially proportional to each other, as shown in FIG. 7. However, when the piezoelectric transformer is brought to a no-load state, the step-up ratio is extremely increased. Therefore, when it is driven continually under the no-load condition, the oscillation rate ultimately exceeds the mechanical strength limit of its element to result in its rupture. Therefore, a piezoelectric transformer which is possibly operated under the no-load condition, requires a protective circuit as a measure against the rupture.

FIG. 8 is a block diagram showing a piezoelectric transformer driver with such a measure, which is proposed in Japanese Laid-Open Patent Publication No. 8-107678. As shown in the figure, a load current comparator 3 detects an output current Io from a piezoelectric transformer 1 into a load 2, and when the current Io becomes lower than a level determined by a reference voltage Vref, it issues a signal Vdown to a frequency sweep oscillator 4, thus reducing the drive frequency of the piezoelectric transformer 1 to increase the step-up ratio of the piezoelectric transformer 1. The output voltage Vo is thus increased to hold the output current Io at an adequate level. As a protective mechanism, an output voltage comparator 6 is provided, which monitors the secondary side output voltage Vo of the piezoelectric transformer 1 and, when this voltage Vo becomes lower than a level determined by a reference voltage Vmax, issues a signal Vup to the frequency sweep oscillator 4 to increase the drive frequency of the piezoelectric transformer 1 from the resonant frequency. The step-up ratio of the piezoelectric transformer 1 is reduced to reduce the output voltage Vo. In this way, rupture of the piezoelectric transformer due to excessive oscillations is prevented.

FIG. 9 shows a circuit construction of the piezoelectric transformer driver described in the Japanese Patent Laid-Open Publication No. 8-107678 noted above. This circuit has been proposed by the inventor in Japanese Patent Laid-Open Publication No. 8-275553. The prior art circuit operation proposed in the prior application will be described in connection with the circuit shown in FIG. 9.

A case where the load 2 is connected to the piezoelectric transformer 1 will now be considered. An AC output voltage Vo outputted from the secondary electrodes 1b of the piezoelectric transformer 1 causes an AC output current Io through the load 2. The output current Io is inputted to the load current comparator 3. The inputted current is converted by a resistor into a voltage, then rectified by a diode D1, and then smoothed to be compared in a comparator 10 with a reference voltage Vref. When the rectified and smoothed voltage obtained from the output current Io is lower, the comparator 10 outputs a "H" level signal as the signal Vdown. This signal Vdown turns on a switch SW1. At its "H" level, its inverted signal from an inverter turns off a switch SW2.

When the switch SW1 is turned on, a capacitor Cvco is charged by a constant current I1 from a constant current source 12. The terminal voltage Vvco across the capacitor Cvco is given as $$Vvco = (I1 \times t)/Cvco$$

and is proportional to the time t.

The terminal voltage Vvco across the capacitor Cvco is inputted to a VCO (voltage-controlled oscillator) 14, and controls the oscillation frequency thereof. The VCO 14 is constructed such that its oscillation frequency is increased as the voltage Vvco is increased. Its output signal is converted in a two-phase drive circuit 19 in a drive circuit 5 into a two-phase rectangular or pulse wave, which constitutes gate voltages Vg1 and Vg2 to alternately on-off operate transistors Q1 and Q2.

The transistors Q1 and Q2 have their drains connected to intermediate terminals of respective auto-transformers T1 and T2 and ground these intermediate terminals alternately. The auto-transformers T1 and T2 have primary side terminals connected to a voltage source VDD. While the transistors Q1 and Q2 are "on", the auto-transformers T1 and T2 store current energy. When the transistors Q1 and Q2 are turned off, they release the stored current energy as voltage energy. The electrostatic capacitance C of the piezoelectric transformer 1 looked from the input side thereof and the inductance L of the auto-transformers T1 and T2, are set such that they can form a voltage resonance waveform. The transistors Q1 and Q2 generate half sinusoidal waves Vd1 and Vd2 at their drains. This is illustrated in FIGS. 10(a) to 10(c).

Where the turns ratio of the primary and secondary sides of the auto-transformers T1 and T2 is 1:N, the half sinusoidal waves Vd1 and Vd2 have a peak voltage which is about 3(N+1) times the source voltage VDD. These waves Vd1 and Vd2 are applied to the primary electrode side of the piezoelectric transformer 1. The piezoelectric transformer 1 outputs to the secondary side the voltage Vo of the step-up ratio Av corresponding to the drive frequency.

When the output signal Vdown of the comparator 10 is inverted to the "L" level as a result of an increase of the output current Io through the load 9 in FIG. 1, the switch SW1 is turned off, and the switch SW2 is turned on. As a result, the capacitor Cvco is discharged by a constant current I2 of a constant current source 13, and the voltage Vvco is gradually reduced in proportion to time. With the gradual reduction of the voltage Vvco, the oscillation frequency of the VCO 14 is increased to increase the drive frequency of the piezoelectric transformer 1.

The VCO 14 is adapted to be oscillated in a range containing the resonant frequency of the piezoelectric transformer 1, and starts frequency sweep from the higher frequency side of the resonant frequency. While the drive frequency is in a high range and the step-up ratio of the piezoelectric transformer 1 is low, the output voltage Vo is low. As the drive frequency is reduced to approach the resonant frequency fr, however, the output voltage Vo is increased to increase the output current Io through the load 2.

When the output current Io reaches a desired level, the output frequency of the frequency sweep oscillator 4 is retained in the neighborhood of the drive frequency corresponding to the desired level of the output current Io while frequently changing the sweep direction upward and downward. In this way, the output current Io is held constant. Where the CCFL is used as the load 2, it is possible to hold a stable brightness because the output current can be held constant.

When the output current Io through the load 2 fails to be at the desired level, the output signal Vdown of the comparator 10 of the drive circuit 5 is continually at the "H" level. In this case, the switch SW1 is continually "on" to continually charge the capacitor Vvco. When the voltage across the capacitor Cvco exceeds a reference voltage Vh of a comparator 11 and reaches a predetermined level, a switch SW4=is turned on. With the turning-on of the switch SW4, the capacitor Cvco is discharged through a resistor RD2. The time constant of the discharge is set to be sufficiently short compared to the seep time, which is determined by the constant current sources 12 and 13 and the capacitor Cvco, and the capacitor Cvco is thus discharged momentarily. The resistance of the resistor RD2 is set to be so low that the constant current I1 caused therethrough when the switch SW1 is turned on is ignorable.

The comparator 11 is imparted with a hysteresis characteristic by a resistance such that the switch SW4 is restored to the "off" state after the voltage across the capacitor Cvco passes a level Vh reversely and reaches a desired lowest level with the discharging of the capacitor Cvco. In other words, the oscillation frequency of the VCO 14 is changed from a lower limit frequency to an upper limit one, and then again the operation of the seep of the drive frequency from the higher to the lower frequency range is repeated.

In the above construction, when the source voltage applied to the inverter shown in FIG. 9 is momentarily reduced to disable the provision of a predetermined level current to the load 2 and cause the drive frequency from being departed from the resonant frequency and reduced to a lower frequency, the drive frequency can be restored to the upper limit frequency side to continue the sweep. That is, when the source voltage is restored, the drive frequency permitting the desired level of the output current Io is restored to restore the stable operation.

The operation will now be described in connection with a case when the load 2 is brought to an open circuit due to some cause, such as damage to the CCFL or breakage of a lead. As described before, with an increase of the output side impedance of the piezoelectric transformer 1 the step-up ratio thereof is extremely increased to generate a high voltage on the secondary electrode side. Consequently, the oscillation rate exceeds a value corresponding to the limit mechanical strength of the piezoelectric element, thus resulting in rupture of the device.

As a method of protection to cope with this, the output voltage Vo of the piezoelectric transformer 1 is inputted to an output voltage comparator 6 for resistive voltage division, rectification by a diode D2 and smoothing to obtain a voltage VR, and this voltage VR is compared in a comparator 17 with a reference voltage Vmax. When the voltage VR becomes higher than Vmax, the output signal Vup of the comparator 17 is inverted to an "H" level to turn on a switch SW3, thus causing discharge of the capacitor Cvco through a resistor RD1. The resistor RD1, like the resistor RD2 noted above, has its resistance set such as to permit the discharge of the capacitor Cvco in a short period of time. Thus, in a short period of time the drive frequency is increased to the upper limit frequency of the VCO 14 to reduce the step-up ratio of the piezoelectric transformer 1 so as to reduce the output voltage Vo. In this way, excessive oscillations of the piezoelectric transformer 1 can be prevented.

FIGS. 11(a) to 11(d) are views forming a timing chart and show voltage waveforms in various parts in the above state, that is, in the no-load state driving of the piezoelectric transformer 1. FIG. 11(a) shows the waveform of the output voltage Vo of the piezoelectric transformer 1. FIG. 11(b) shows the waveform of the rectified and smoothed voltage VR obtained from Vo. When the voltage VR reaches Vmax, the signal Vup is inverted to the "H" level to cause discharge of the Cvco, thus quickly reducing the voltage Vvco as shown in FIG. 11(c). With the reduction of Vvco, the oscillation frequency of the VCO 14 is shifted to the higher frequency range side, thus reducing the output voltage VR of the piezoelectric transformer 1. The voltage VR is thus reduced to cause inversion of the voltage Vup to the "L" level again and turn off the switch SW3. A state of control by the "H" level of the voltage Vdown outputted from the load current comparator 3 is thus restored. The above operation is repeated, and the drive frequency is continuously swept between the upper limit frequency fh of the VCO 14 and the frequency fp of the signal Vup in the step-up ratio Av versus frequency characteristic as shown in FIG. 11(d).

It will be seen from the above that it is possible to prevent rupture of the piezoelectric transformer 1 by setting the voltage Vmax such that it exceeds the rectified and smoothed voltage VR within the level corresponding to the upper limit of the oscillation speed of the piezoelectric transformer 1.

A piezoelectric transformer has a characteristic that its resonant frequency is varied with the load impedance, as is seen from the graph of FIG. 6. In order to cover the resonant frequency range, it is necessary to set a side oscillation frequency range of the VCO for generating the drive frequency. The VC0 14, meanwhile, is usually constructed by using capacitors and constant current sources to facilitate its fabrication in IC. Its oscillation frequency, however, is fluctuated in the order of 20% with fluctuations of the capacitors and constant current sources and temperature changes.

An electromagnetic transformer (i.e., coil) as a drive, as shown in FIG. 10(a), generates a half-wave rectified wave by obtaining the resonance of the piezoelectric transformer input capacitance from the input DC voltage VDD. Generally, the inductance varies greatly, and the LC product also fluctuates by about 20%. Where the LC product is highly set, as shown in FIG. 10(b), on the higher frequency range side of the VCO 14 a transistor Q1 is turned on before its drain voltage Vd1 is restored to the zero level, thus disabling the zero-volt switching (ZVS). Therefore, a great surge current is generated in the drive circuit to cause heat generation in inductor and switching transistors in the drive circuit and, in an extreme case, rupture of the circuit.

FIGS. 12(a) and 12(b) illustrate this status. Specifically, the figures are graphs showing the relation between the input current IDD to the drive circuit and the drive frequency thereof. When the resonant frequency is low due to L and C fluctuations, the ZVS is not caused with the drive frequency higher than fa. Consequently, the input current is quickly increased to increase the heat generation, as shown in FIG. 12(b).

To avoid such an inconvenience, it is necessary to set the LC product to an adequate value, i.e., a sufficiently low value, by taking the above variation (i.e., fluctuations in manufacture) as well into considerations. With a reduced LC product, however, the drive voltage waveform tends to go to the negative side during the "off" period of the transistor Q1 as in the case of L·C=MIN in FIG. 10(b). Therefore, a current is again caused in a diode as the body of the transistor Q1, thus resulting in current energy consumption in the electromagnetic transformer (i.e., coil) and giving rise to heat generation.

When the piezoelectric transformer drive voltage waveform gets out of the ZVS, it contains harmonics in either case, and the conversion efficiency of the piezoelectric transformer is reduced.

It will be seen that with the above prior art technique it has been difficult to set the oscillation frequency of the VCO 14 and the resonant frequency of the drive circuit such as to obtain an efficient state without possibility of heat generation in the drive circuit.

Another problem in the above prior art control is that when a prescribed level is exceeded by the secondary voltage of the piezoelectric transformer 1, the oscillation frequency thereof is shifted to the higher frequency range side to reduce the step-up ratio so as to increase the secondary voltage. In such a method of control, however, the piezoelectric transformer 1 is operated at a high oscillation rate, although in a short period of time, while it outputs a high secondary voltage. A piezoelectric transformer has a character that its heat generation is increased quickly when its oscillation rate exceeds a certain value as shown in FIG. 13. For the reason, when the piezoelectric transformer 1 continues no-load operation, its polarization deterioration or damage to its supports are caused by heat generation.

FIGS. 14(a) to 14(d) show variations of the waveform of the output voltage Vo of the piezoelectric transformer 1 in no-load operation thereof when the oscillation frequency of the VCO 14 is fluctuated. The oscillation frequency is swept between fp and fh. In the case shown in FIG. 14(b), the upper limit frequency fhl of sweep is low. In this case, the step-up ratio of the piezoelectric transformer 1 is not reduced so much, so that the lowest envelope level of the output voltage Vo is not reduced so much. Consequently, great heat is generated in the piezoelectric transformer 1.

With an increase of the upper limit frequency of sweep, the sweep time is increased to reduce the heat generation in the piezoelectric transformer 1.

SUMMARY OF THE INVENTION

A first object of the present invention is to provide a piezoelectric transformer driver, which can suppress heat generation and is capable of high efficiency driving of a piezoelectric transformer.

A second object of the present invention is to suppress heat generation in a piezoelectric transformer.

The above objects of the present invention are attained by providing an output voltage comparator which includes a first and a second detector for detecting an upper and a lower limit level, respectively, of the output voltage of a piezoelectric transformer, and a frequency sweep oscillator, which causes the oscillation frequency of a VCO to a higher frequency range side when the first detector detects that the output voltage has become higher than the upper limit level, and restores VCO oscillation frequency sweep according to an output current when the output voltage of the second detector has become lower than the lower limit level.

More specifically, according to an aspect of the present invention, there is provided a piezoelectric transformer driver comprising a drive circuit for driving a piezoelectric transformer, a frequency sweep oscillator for determining the drive frequency of the drive circuit, a load current comparator for determining the frequency sweep direction of the frequency sweep oscillator by comparing an output current carried by a load of the piezoelectric transformer with a reference level, and an output voltage comparator including a first and a second detector for detecting an upper and a lower limit level, respectively, of the output voltage of the piezoelectric transformer, the frequency sweep oscillator being operable, in a steady-state operation, to sweep the drive frequency to a higher or a lower frequency range side in dependence on whether the output current is higher or lower than the reference level and, when the output voltage becomes higher than the upper limit level, to sweep the drive frequency to the higher frequency range side by giving preference to the sweep direction determined according to the output current until the output voltage becomes lower than the lower limit level.

According to another aspect of the present invention, there is provided a piezoelectric transformer driver a in having an oscillation frequency of a frequency sweep oscillator which controls a drive frequency of a piezoelectric transformer comprising an output voltage comparator which includes a first and a second detector for detecting an upper and a lower limit level, respectively, of an output voltage of the piezoelectric transformer, the oscillation frequency of the frequency sweep oscillator being changed to a higher frequency range side when the first detector detects that the output voltage has become higher than the upper limit level, and restores the oscillation frequency sweep according to an output current when the output voltage of the second detector has become lower than the lower limit level.

In the piezoelectric transformer driver according to the present invention, when it is detected in the output voltage comparator 6 that the predetermined upper limit level has been reached by the output voltage Vo of the piezoelectric transformer 1, the frequency of the frequency sweep oscillator is not increased up to the upper limit frequency but is increased only up to a frequency corresponding to the lower limit level of voltage set in the output voltage comparator. It is thus possible to set a frequency sweep range without being adversely affected by fluctuations, if any, of the upper limit frequency of the frequency sweep oscillator (i.e., VCO). Thus, it is possible to eliminate a situation that the ZVS is disabled as in the case of L·C=MAX as shown in FIG. 10(b). In addition, it is possible to avoid setting of the resonant frequency to an unnecessary higher frequency that is determined by the inductance L of the drive circuit and the equivalent capacitance C of the piezoelectric transformer 1 looked from the primary side thereof. Thus, it is possible to avoid a fall of the drain voltage on the transistor Q1 to be below zero before the transistor Q1 is turned on as in the case of L·C=MIN shown in FIG. 10(b). That is, it is possible to set the L·C resonant frequency to the drive frequency, suppress the heat generation in the drive circuit, make the drive circuit output voltage waveform to be close to a sinusoidal wave, and improve the conversion effect of the piezoelectric transformer.

Moreover, since it is possible to set the upper limit frequency of the frequency sweep oscillator to a high frequency, it is possible to sufficiently reduce the no-load operation output voltage Vo, thus permitting reduction of the effective level of the output voltage Vo to reduce the oscillation rate and heat reduction of the piezoelectric transformer 1.

Other objects and features will be clarified from the following description with reference to attached drawings.

BRIEF DESCRIPTION OF THE DRAWINGS

FIGS. 11(a) to 11(d) are drawings of timing charts and voltage waveforms in various parts in the prior art circuit;

FIG. 13 shows a relationship between the vibration rate and the temperature rise; and FIGS. 14(a) to 14(d) show variations of the waveform of the output voltage of the piezoelectric transformer in no-load operation thereof when the oscillation frequency of the VCO is fluctuated.

PREFERRED EMBODIMENTS OF THE INVENTION

Embodiments of the present invention will now be described with reference to the drawings.

Figure 1:
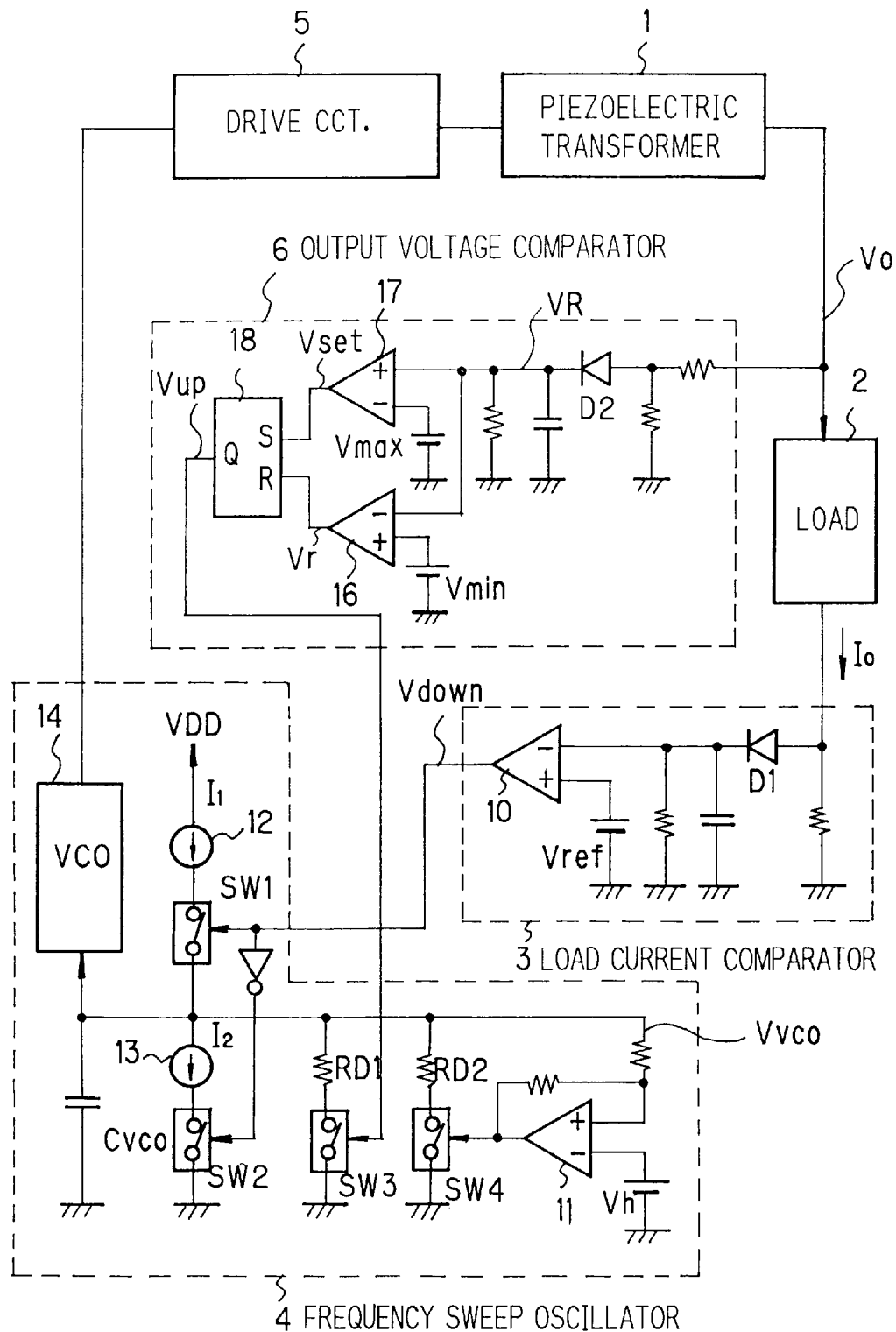
FIG. 1 is a circuit diagram showing a first embodiment of the present invention.

FIG. 1 is a circuit diagram showing a first embodiment of the present invention. The illustrated embodiment comprises a certain circuit which is added to the prior art piezoelectric transformer driver shown in FIG. 9. In FIG. 1, parts like those in FIG. 9 are designated by like reference numerals (the piezoelectric transformer 1 and the drive circuit 5 being shown as blocks).

Figure 9:
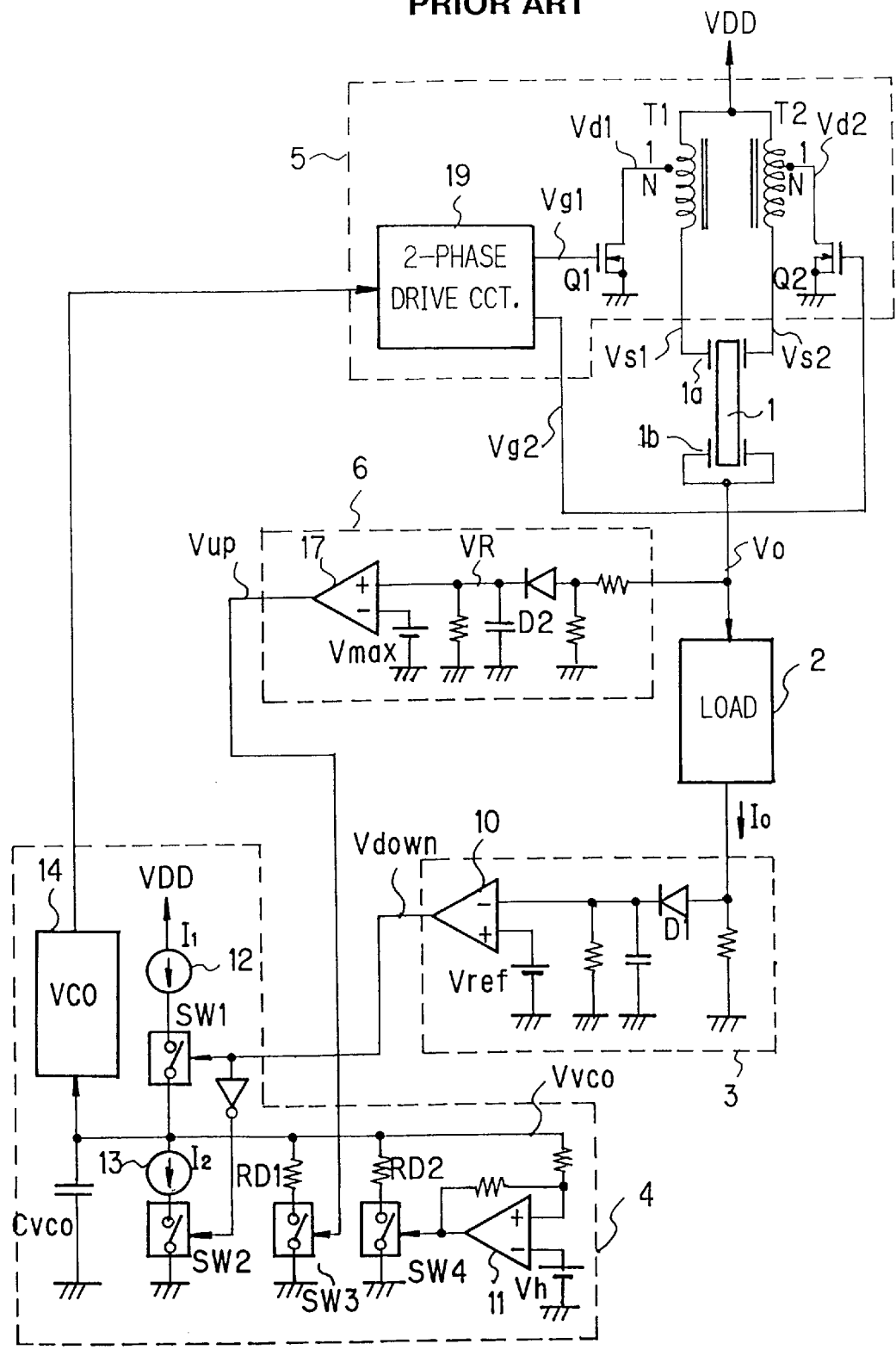
FIG. 9 shows a circuit construction of the prior art piezoelectric transformer driver.
Figure 10:
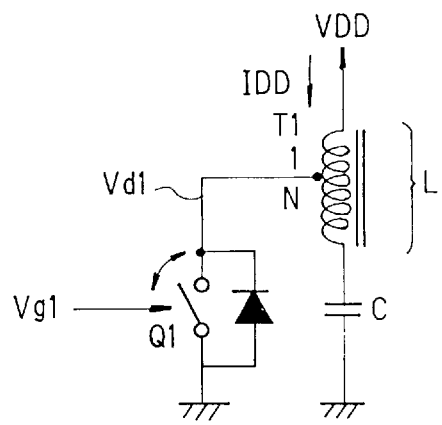
FIGS. 10(a)–10(c) show an equivalent electric circuit and voltage resonance waveforms.
Figure 10:
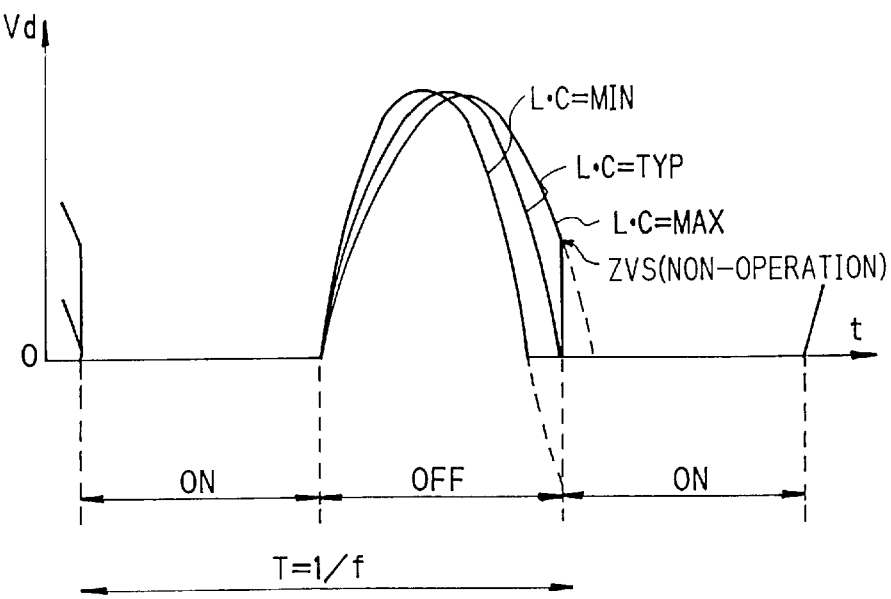
Figure 10:
Figure 12:
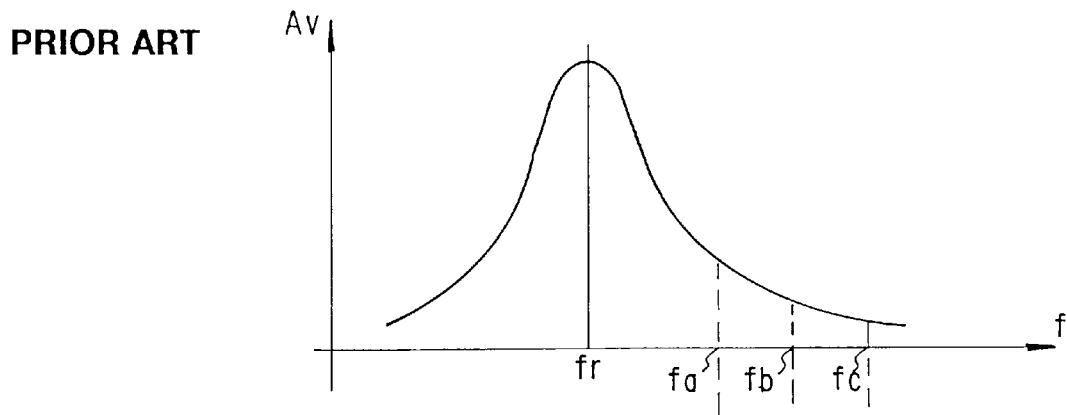
FIGS. 12(a) and 12(b) show frequency characteristic of the input current in the driving circuit.
Figure 12:
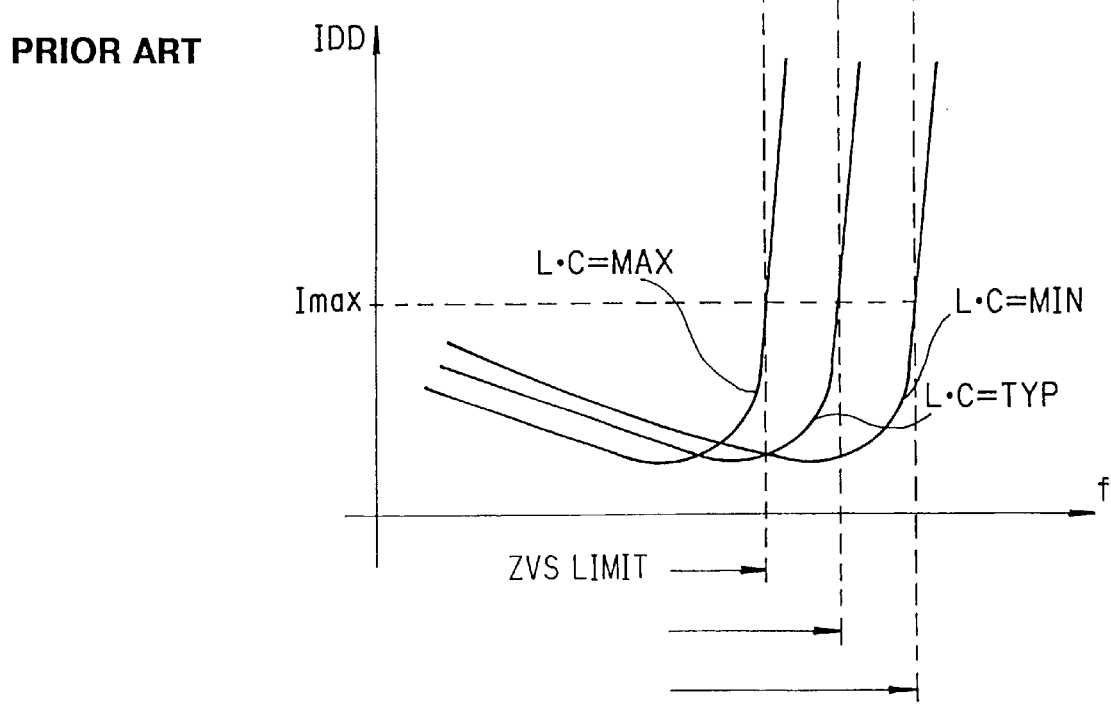

This embodiment of the piezoelectric transformer is different from the prior art circuit shown in FIG. 9 in that a flip-flop 18 is added, which is set by the output signal of the comparator 17 comparing the rectified and smoothed voltage VR obtained form the output voltage Vo with Vmax and reset by the output signal Vr of a comparator 16 comparing the voltage VR with Vmin, and that the output voltage of the flip-flop 18 is used as the output signal Vup of the output voltage comparator 6 which on-off operates the switch SW3, the remainder of the circuit construction being the same as in the circuit shown in FIG. 9.

In the circuit of the embodiment shown in FIG. 1, when the load 2 is normally connected, the load current comparator 3 performs the same control as in the prior art technique shown in FIG. 9 to stabilize the output current Io. Specifically, the output current Io through the load 2 is inputted to the load current comparator 3 for rectification in the diode D1 into a DC voltage, which is inputted to the comparator 10 for comparison with the reference level Vref. When the output current Io is lower than a desired level, the output signal Vdown of the comparator 10 is at the "H" level and increases the input voltage Vvco inputted to the VCO 14 of the frequency sweep oscillator 4. The oscillation frequency of the VCO 14, and hence the drive frequency of the piezoelectric transformer 4, is gradually reduced to approach the resonant frequency of the piezoelectric transformer 1, thus increasing the step-up ratio Av. When the current through the load 2 reaches the desired level, the signal Vdown is inverted to the "low" level, thus increasing the drive frequency to reduce the output current Io. By making this sweep direction switching frequently, the drive frequency is retained in the neighborhood of the frequency corresponding to the desired level of the output current, thus stabilizing the output current Io.

When the desire level of the output current Io fails to be obtained, the voltage Vvco continues to be increased to continually reduce the frequency of the frequency sweep oscillator 4. When the lower limit frequency is reached, the comparator 11 turns on the switch SW4, thus discharging the capacitor Cvco to increase the drive frequency up to the upper limit frequency in a short period of time. Then, the frequency is swept to the lower frequency range side down to the drive frequency corresponding to the desired level of the output current Io.

Now, the operation of the circuit shown in FIG. 1 will be described in the case when the load 2 is open-circuited.

When the high output side impedance state of the piezoelectric transformer 1 is brought about, the output voltage Vo is increased, thus increasing the rectified and smoothed voltage VR on the output voltage comparator 6 to become higher than the reference level Vmax. As a result, the output voltage Vset of the comparator 17 is inverted to the "H" level to set the flip-flop 18. The output voltage Vup of the flip-flop 18 is thus inverted to the "H" level to turn on the switch SW3.

The output voltage comparator 6 is permitted to monitor the reduction of the output voltage Vo of the piezoelectric transformer 1 by setting the time constant, which is based on the resistance of the resistor RD1 connected to the switch SW3 and the capacitance of the capacitor Cvco to be long compared to the case of the prior art technique shown in FIG. 9. When the rectified and smoothed voltage VR inputted to the comparator 16 which is newly provided in the output voltage comparator 6 becomes lower than the other reference level Vmin lower than Vmax, the output voltage Vr of the comparator 16 is inverted to the "H" level to reset the flip-flop 18 and invert the signal Vup to the "L" level, thus restoring the "off" state of the switch SW3.

Figure 2:
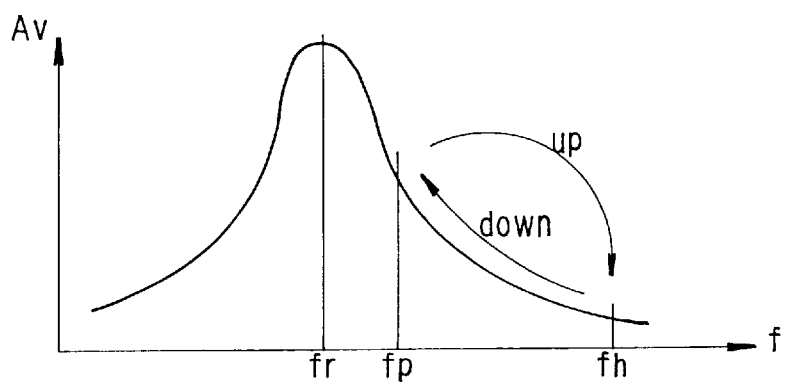
FIGS. 2(a)–2(c) show drawings for explaining the operation of the piezoelectric transformer 1 shown in FIG. 1.
Figure 2:
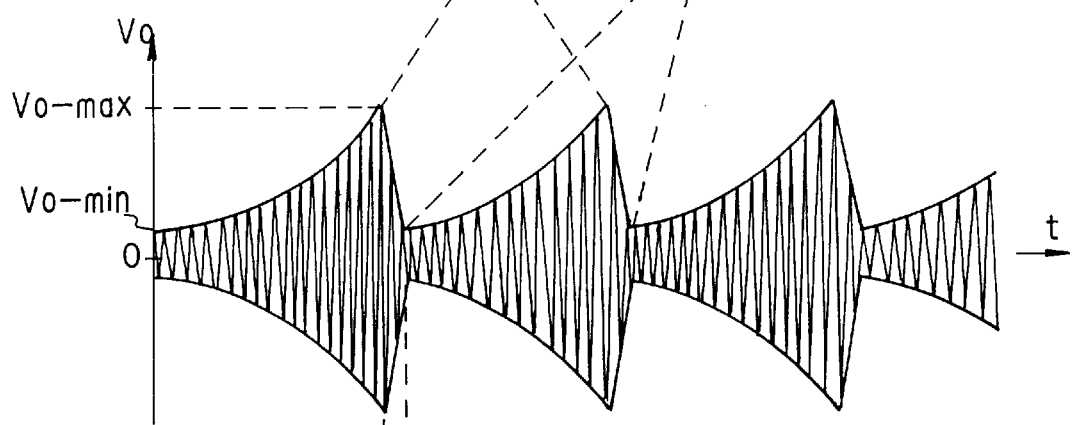
Figure 2:
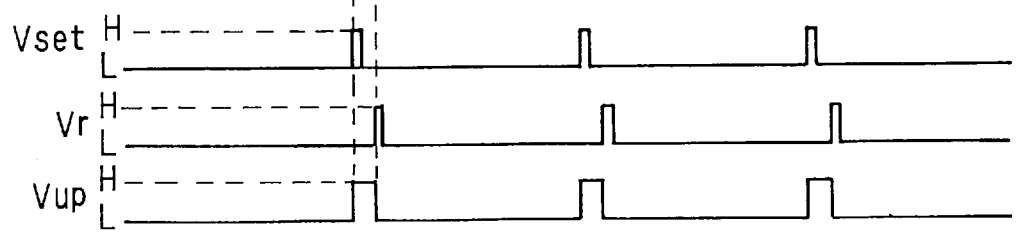

FIG. 2(a) shows the step-up characteristic of the piezoelectric transformer 1, FIG. 2(b) shows the output waveform of the transformer 1, and FIG. 2(c) shows the input and output waveforms of the flip-flop 18. When the output voltage Vo of the piezoelectric transformer 1 becomes Vo_max, the signal Vset is inverted to the "H" level and inverted the signal Vup to the "H" level. The drive frequency is thus swept to the higher frequency range side. When the voltage Vo becomes Vo_min, the voltage Vr is inverted to the "H" level, thus restoring the signal Vup to the "L" level. The drive frequency is thus swept in the reducing direction again.

As shown above, the minimum level Vo_min of the envelope of the output voltage Vo of the piezoelectric transformer 1 can be set by setting the reference level Vmin. Thus, it is possible to prevent the drive frequency in the no-load operation from being increased beyond the frequency, at which Vo is equal to Vo-min, when the upper limit frequency of the VCO 14 is fluctuated to the higher drive frequency side.

Figure 3:
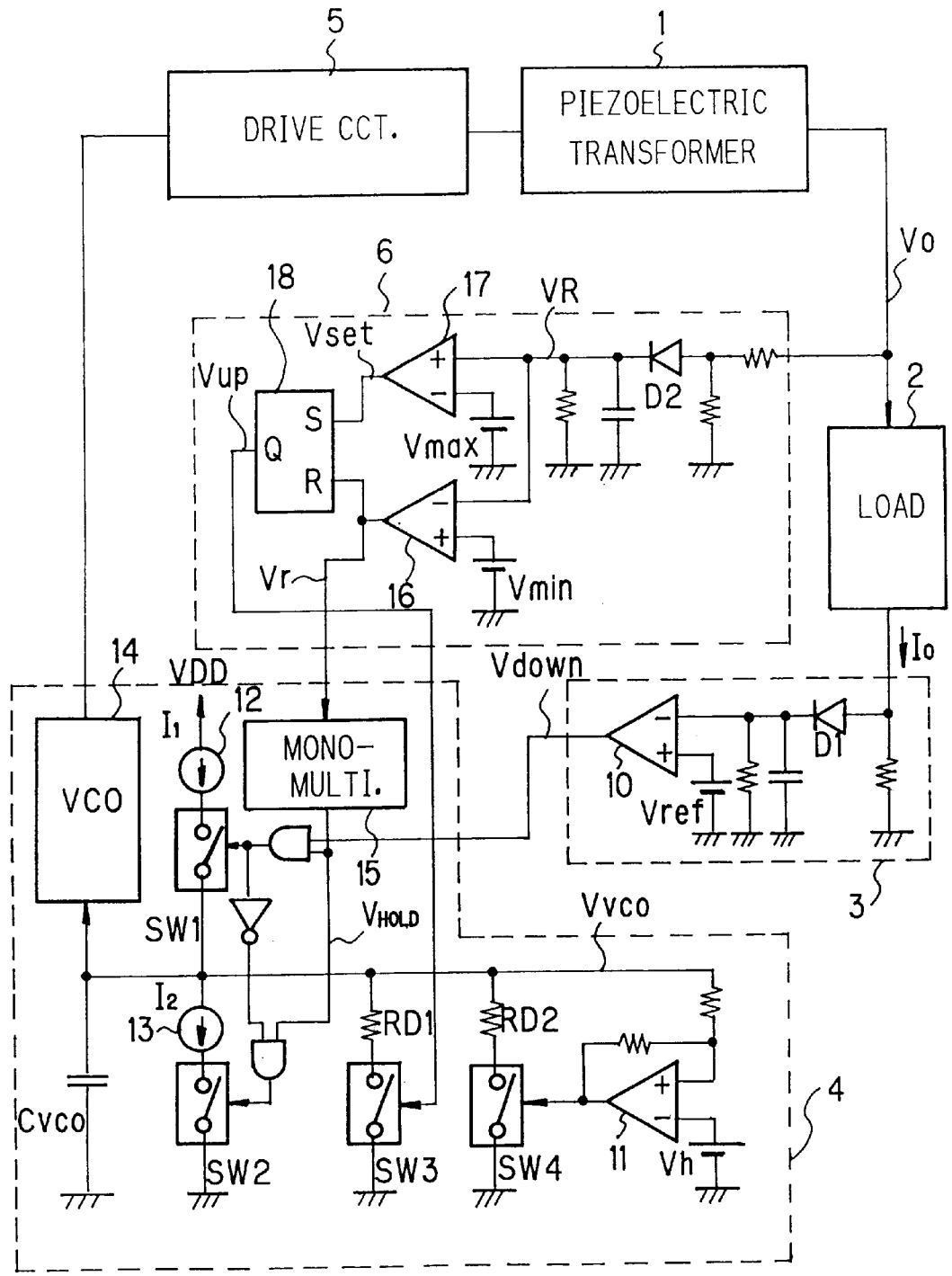
FIG. 3 is a circuit diagram showing a second embodiment of the present invention.

FIG. 3 is a circuit diagram showing a second embodiment of the present invention. The circuit of this embodiment is different from the circuit of the first embodiment shown in FIG. 1 in that a mono-stable multi-vibrator 15 is additionally provided, which normally provides an "H" level signal, is triggered by the signal Vr and provides an output signal for gating the voltage Vdown. Thus, when the drive frequency is increased to fh, it is held at fh for a predetermined period of time (i.e., the operation time of the mono-stable multi-vibrator).

Figure 4:
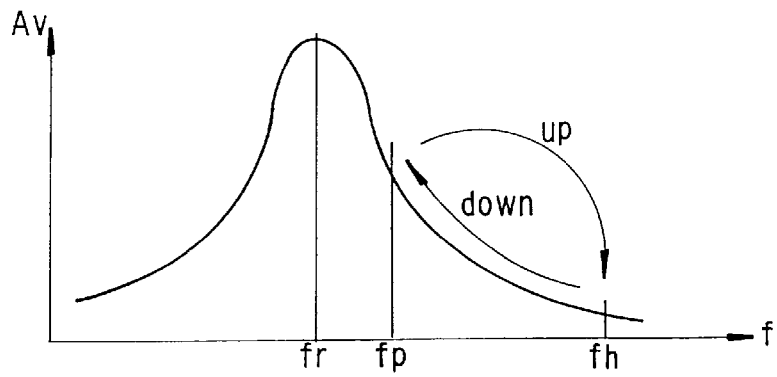
FIGS. 4(a)–4(d) show drawings for explaining the operation of the piezoelectric transformer 1 shown in FIG. 3.
Figure 4:
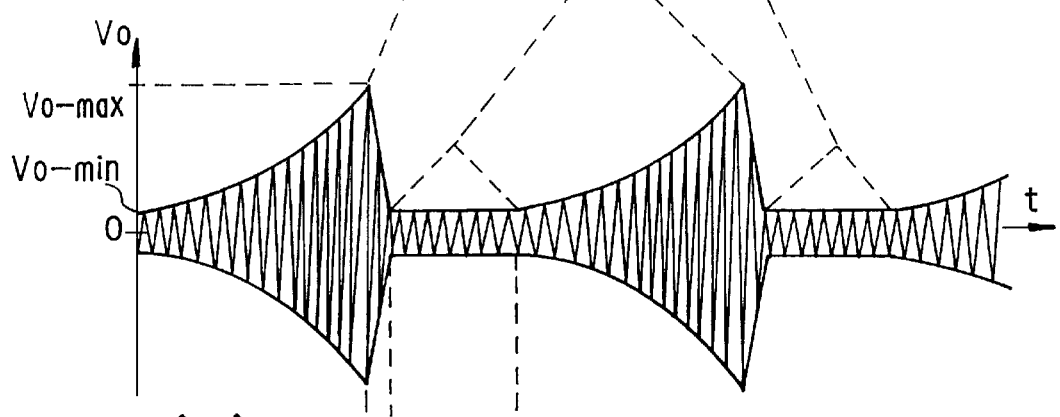
Figure 4:
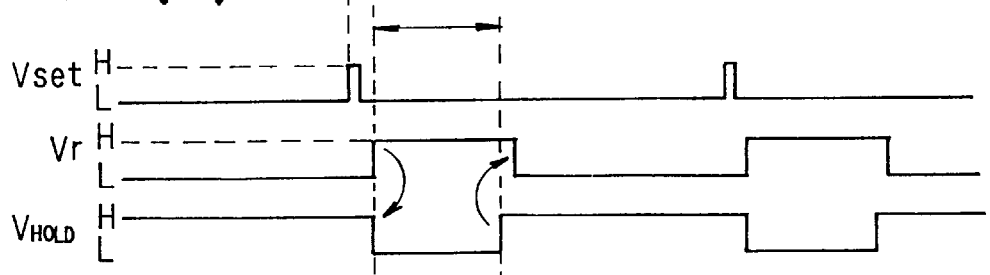
Figure 4:
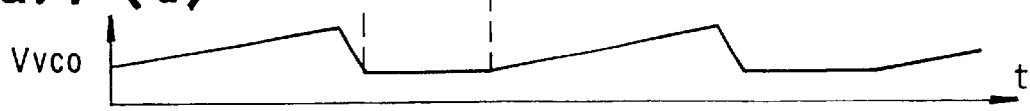
Figure 5:
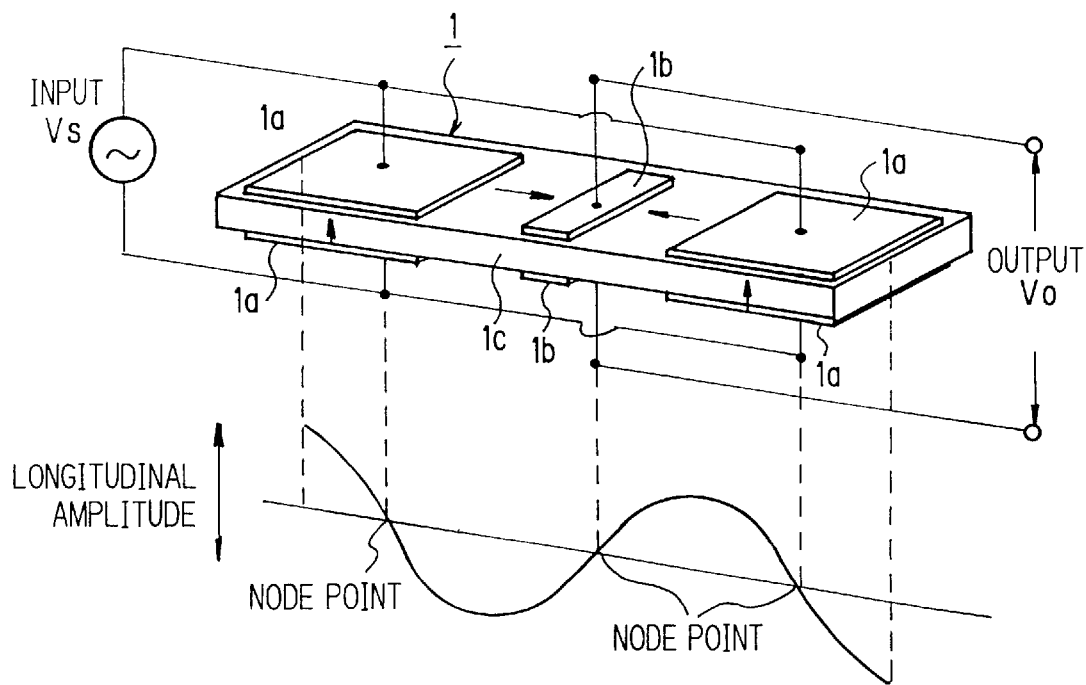
FIGS. 5(a) and 5(b) show a perspective view of a third-order Rosen piezoelectric transformer and an equivalent electric circuit of thereof.
Figure 5:
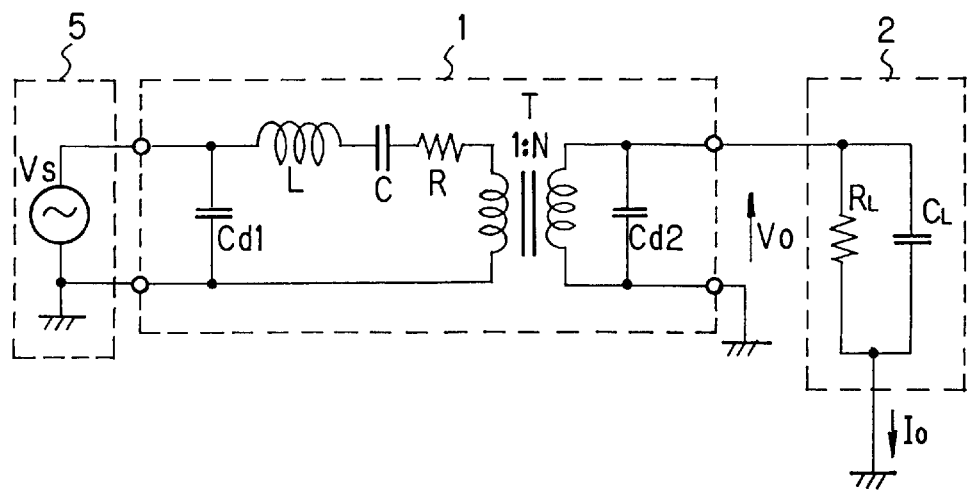
Figure 6:
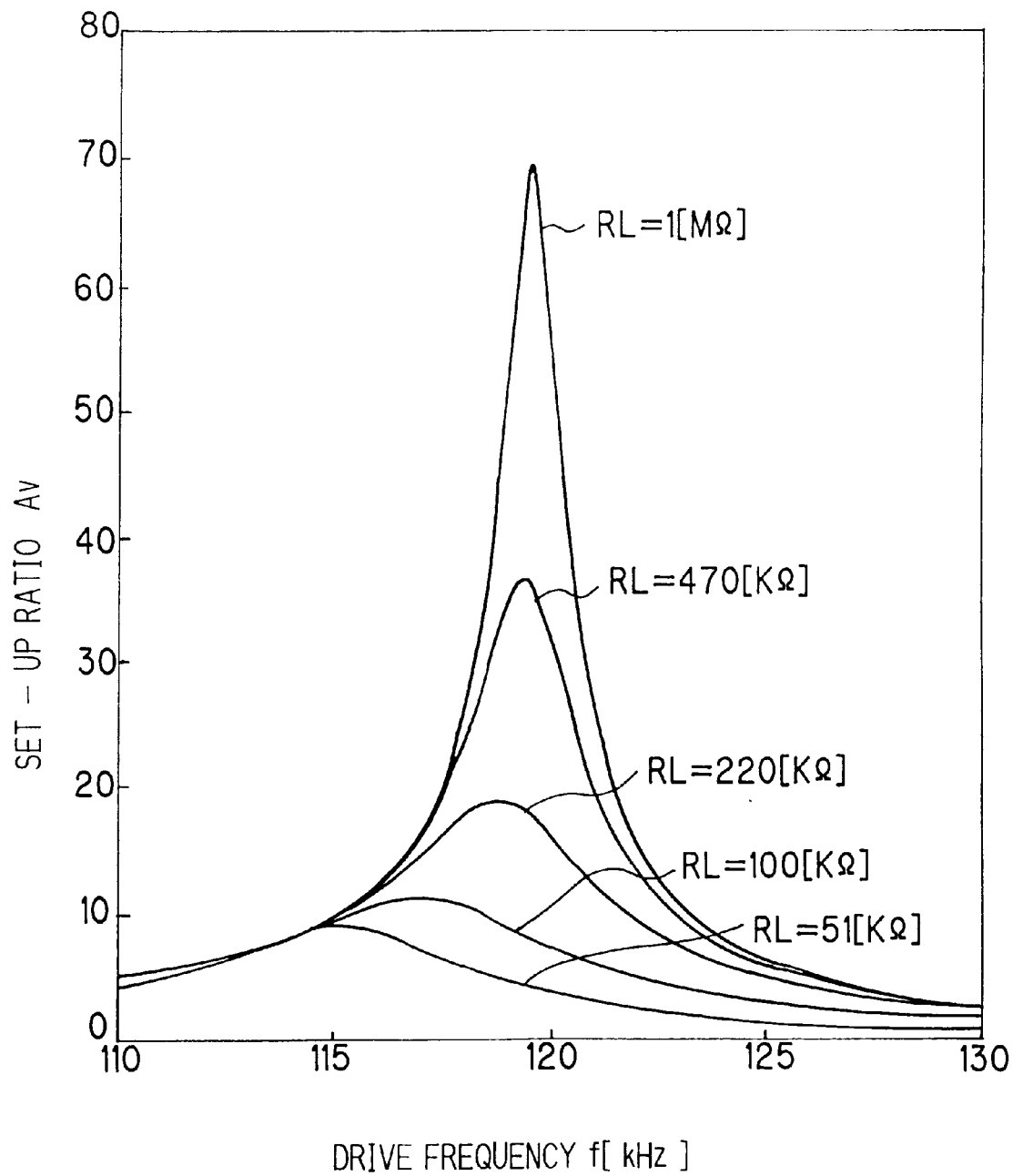
FIG. 6 shows a relationship between the step-up ratio Av and driving frequency with different load impedance RL.
Figure 7:
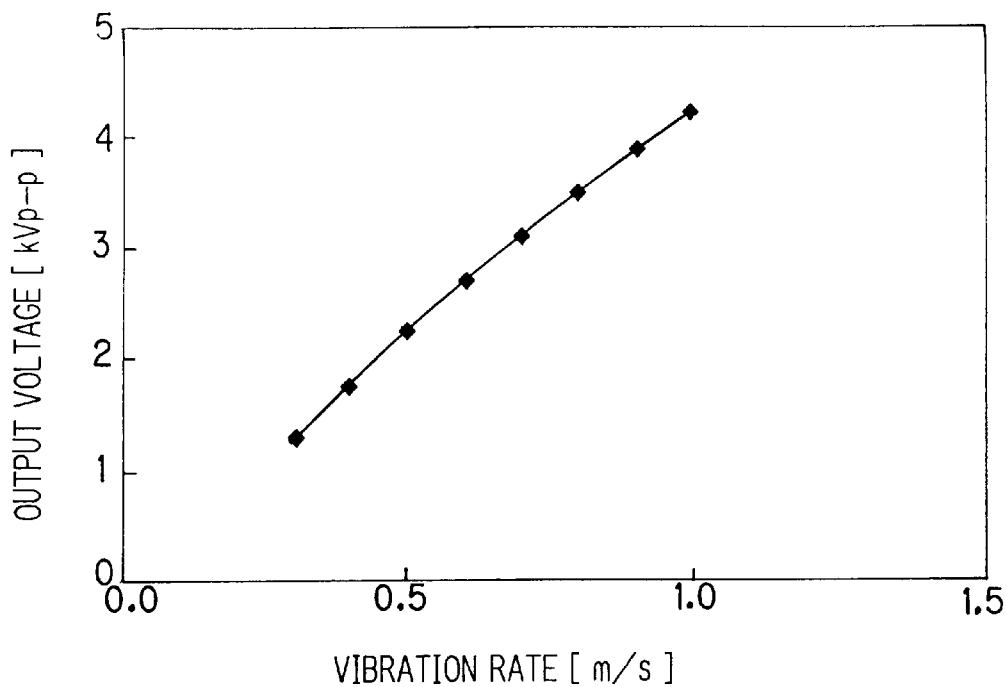
FIG. 7 shows a relationship between the output voltage and the oscillation rate.
Figure 8:
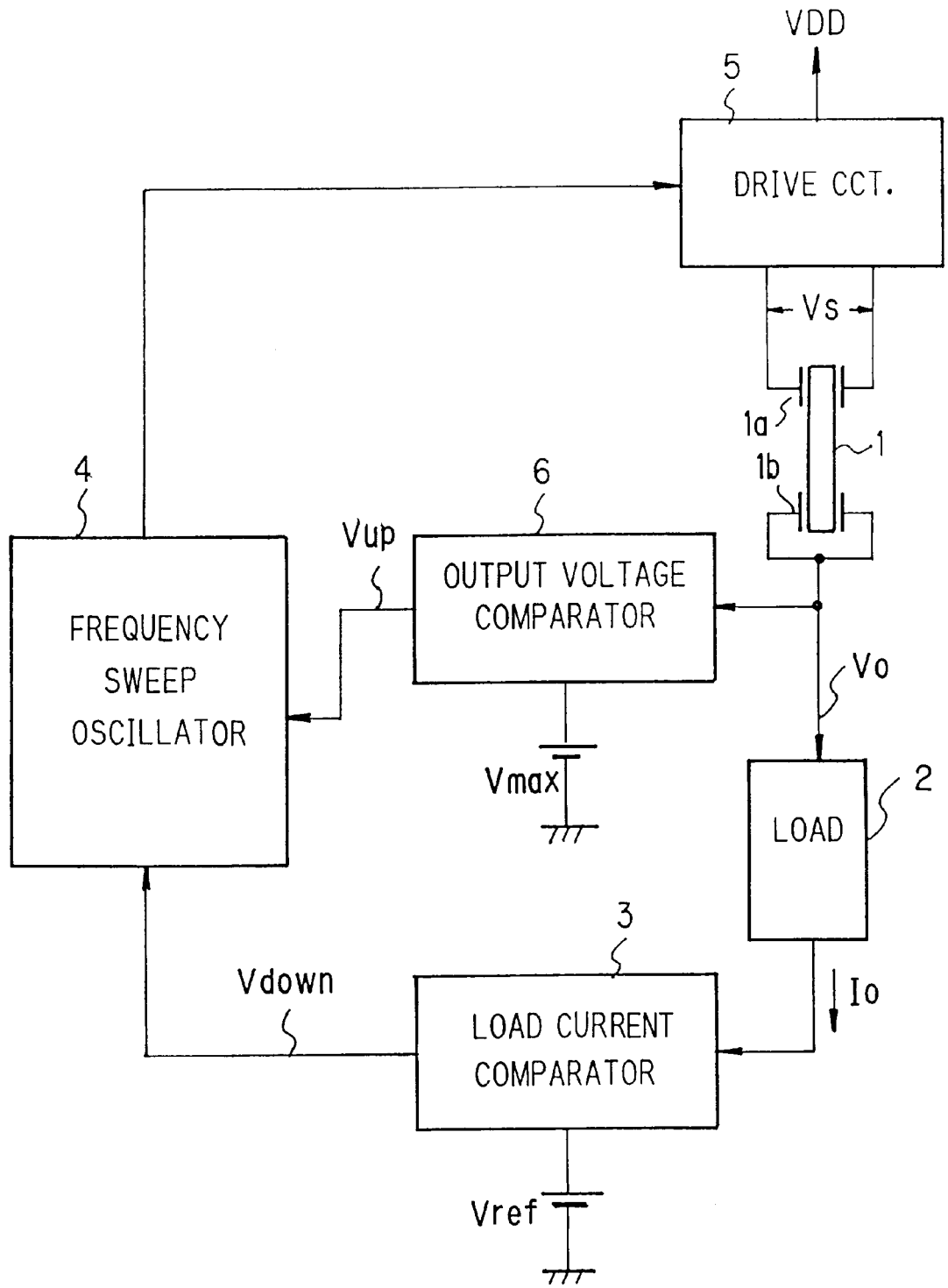
FIG. 8 is a block diagram showing a prior art piezoelectric transformer driver.

The operation of the circuit shown in FIG. 3 is the same as in the circuit shown in FIG. 1 described above when the load 2 is normally connected. The no-load operation will now be described with reference to FIGS. 4(a) to 4(c). FIG. 4(a) shows the step-up characteristic of the piezoelectric transformer 1, FIG. 4(b) shows the output waveform of the transformer, FIG. 4(c) shows the input and output waveforms of the mono-stable multi-vibrator 15, and FIG. 4(d) shows the charging voltage waveform of the capacitor Cvco.

When the output voltage Vo of the piezoelectric transformer 1 is reduced to Vo_min, the voltage Vr is inverted to the "H" level to invert the signal Vup to the "L" level, thus turning off the switch SW3. With the inversion of the signal Vr to the "H" level, the mono-stable multi-vibrator 15 is operated to hold a signal VHOLD at the "L" level for a predetermined period of time. While the signal VHOLD is at the "L" level, the switches SW1 and SW2 are both held "off" irrespective of the level of the output signal Vdown of the load current comparator 3. During this period, the voltage Vvco across the capacitor Cvco is held constant to hold the drive frequency at fh.

The construction as described above permits setting the output voltage Vo of the piezoelectric transformer 1 to be at a lower level in effect in the no-load operation.

As has been described in the foregoing, according to the present invention it is possible to set the oscillation frequency of the VCO in the no-load operation to a frequency corresponding to a predetermined piezoelectric transformer step-up ratio even when the oscillation frequency range is extended to the higher frequency range. Thus, it is possible to avoid disabling of the ZVS with respect to the drive voltage. This means that it is possible to avoid setting of the resonant frequency that is determined by the inductance L of the drive circuit and the equivalent capacitance C of the piezoelectric transformer 1 looked from the primary side thereof to an unnecessarily high value, and the oscillation frequency can be set to a value close to the actual drive frequency, thus preventing a drain voltage fall to be below zero before the switching transistor is turned on and suppressing heat generation in the drive circuit. In addition, it is possible to make the drive waveform to be close to a sinusoidal wave and thus improve the conversion efficiency of the piezoelectric transformer.

Moreover, according to the present invention it is possible to set the maximum oscillation frequency of the piezoelectric transformer to a high frequency and thus avoid the inconvenience that the no-load operation output voltage Vo cannot be sufficiently reduced due to maximum oscillation fluctuation to the lower frequency side, which would be caused by fluctuations of the VCO in manufacture. Thus, it is possible to suppress heat generation in the piezoelectric transformer and prevent polarization deterioration and damage to the element.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A piezoelectric transformer driver comprising a drive circuit for driving a piezoelectric transformer, a frequency sweep oscillator for determining the drive frequency of the drive circuit, a load current comparator for determining the frequency sweep direction of the frequency sweep oscillator by comparing an output current carried by a load of the piezoelectric transformer with a reference level, and an output voltage comparator including a first and a second detector for detecting an upper and a lower limit level, respectively, of the output voltage of the piezoelectric transformer, the frequency sweep oscillator being operable, in a steady-state operation, to sweep the drive frequency to a higher or a lower frequency range side in dependence on whether the output current is higher or lower than the reference level and, when the output voltage becomes higher than the upper limit level, to sweep the drive frequency to the higher frequency range side by giving preference to the sweep direction determined according to the output current until the output voltage becomes lower than the lower limit level.

2. The piezoelectric transformer driver according to claim 1, wherein when the output voltage becomes lower than the lower limit level after becoming higher than the upper limit level, the frequency sweep oscillator holds the prevailing drive frequency for a predetermined period of time and is then restored to a state, in which the oscillation frequency sweep direction is determined according to the output current.

3. The piezoelectric transformer driver according to claim 1 or 2, wherein the frequency sweep oscillator includes a capacitor to be charged to a voltage determining the oscillation frequency, pluralities of switches and current sources for controlling the charging and discharging of the capacitor, and a voltage-controlled oscillator connected to the capacitor.

4. The piezoelectric transformer driver according to claim 3, wherein a switch connected to a circuit for charging or discharging the capacitor is controlled by a flip-flop which is set by the output signal of the first detector and reset by the output signal of the second detector.

5. A piezoelectric transformer driver according to claim 3, which further comprises a voltage monitor means for monitoring the voltage across the capacitor and, when detecting that the voltage across the capacitor has become a predetermined level and that the drive frequency determined by the frequency sweep oscillator becomes the lowest frequency, changing quickly the voltage of the capacitance to sweep the oscillation frequency to the higher frequency side.

6. A piezoelectric transformer driver having an oscillation frequency of a frequency sweep oscillator which controls a drive frequency of a piezoelectric transformer comprising an output voltage comparator which includes a first and a second detector for detecting an upper and a lower limit level, respectively, of an output voltage of the piezoelectric transformer, the oscillation frequency of the frequency sweep oscillator being changed to a higher frequency range side when the first detector detects that the output voltage has become higher than the upper limit level, and restores the oscillation frequency sweep according to an output current when the output voltage of the second detector has become lower than the lower limit level.

* * * * *